(12) United States Patent
Wing et al.

(10) Patent No.: US 8,299,811 B2
(45) Date of Patent: Oct. 30, 2012

(54) UNIVERSAL FRONT/BACK POST TERMINAL BLOCK AND TEST LINK

(75) Inventors: Barden J. Wing, New Albany, IN (US); Zhenzhong Long, Prospect, KY (US); Rakesh Malhotra, Chino Hills, CA (US)

(73) Assignee: Invensys Rail Corporation, Louisville, KY (US)

( * ) Notice: Subject to any disclaimer, the term of this patent is extended or adjusted under 35 U.S.C. 154(b) by 371 days.

(21) Appl. No.: 12/652,001

(22) Filed: Jan. 4, 2010

(65) Prior Publication Data

US 2011/0163775 A1     Jul. 7, 2011

(51) Int. Cl.
*G01R 31/00*     (2006.01)
(52) U.S. Cl. .................................. 324/756.01
(58) Field of Classification Search ........................ None
See application file for complete search history.

(56) References Cited

U.S. PATENT DOCUMENTS 1,948,470 A   *   2/1934   Lavarack ...................... 439/809
2010/0112837 A1 *  5/2010   Lewis .............................. 439/95

OTHER PUBLICATIONS

Pictures of Safetran Systems Terminal Board, dated Feb. 10, 1999, 3 pages.

* cited by examiner

*Primary Examiner* — Vinh Nguyen
(74) *Attorney, Agent, or Firm* — DLA Piper LLP US

(57) ABSTRACT

A terminal board is part of a terminal board assembly for terminating and testing of railroad wires. The board includes a first terminal block with a front post and a back post installed on a plane, along with a plurality of terminal blocks with front posts. A control test link, with an insulating material lining one of three holes, is installed on the front posts of terminal blocks. A test nut, connectable to the front post of the first terminal block, has a face with a depression formed therein to contact the test link when installed on the front post of the first terminal block over the insulating material. First wiring is attached on the plane's front, and second wiring is terminated on the plane's back. A surge protection component and the control test link are pre-installed on the front of the plane, providing for easy removal.

11 Claims, 8 Drawing Sheets

100

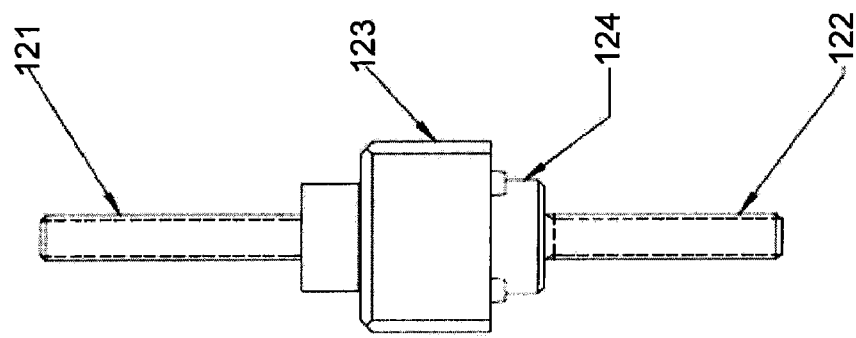
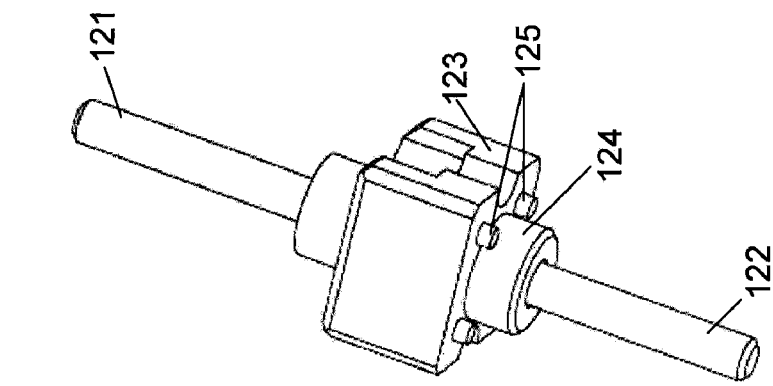
Fig. 2

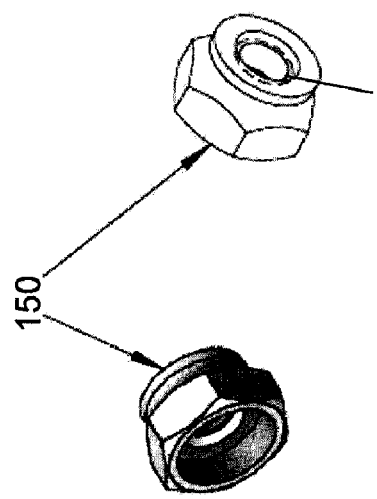
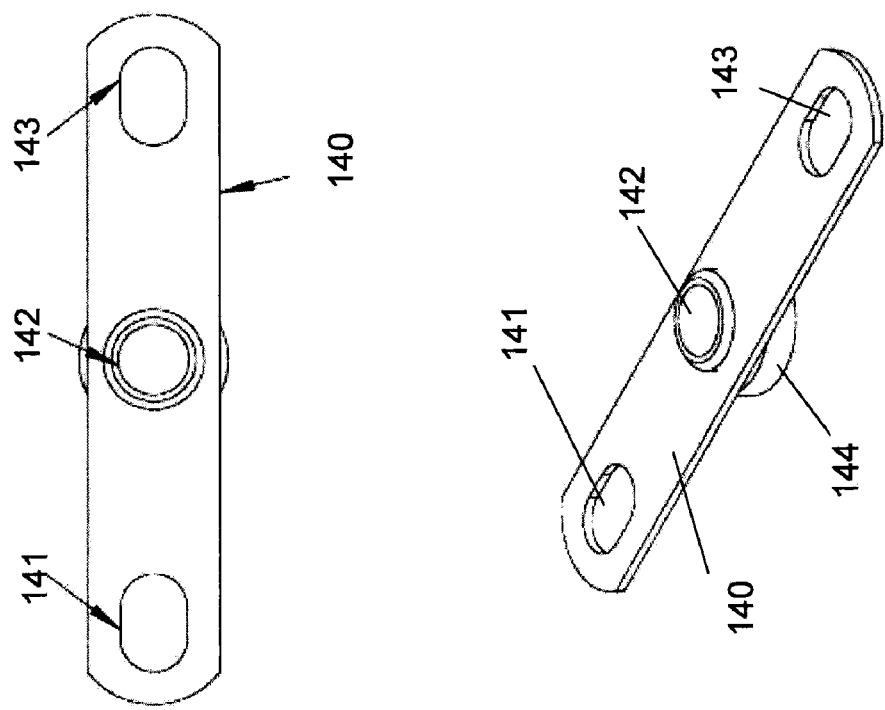
Fig. 3b
Fig. 3a

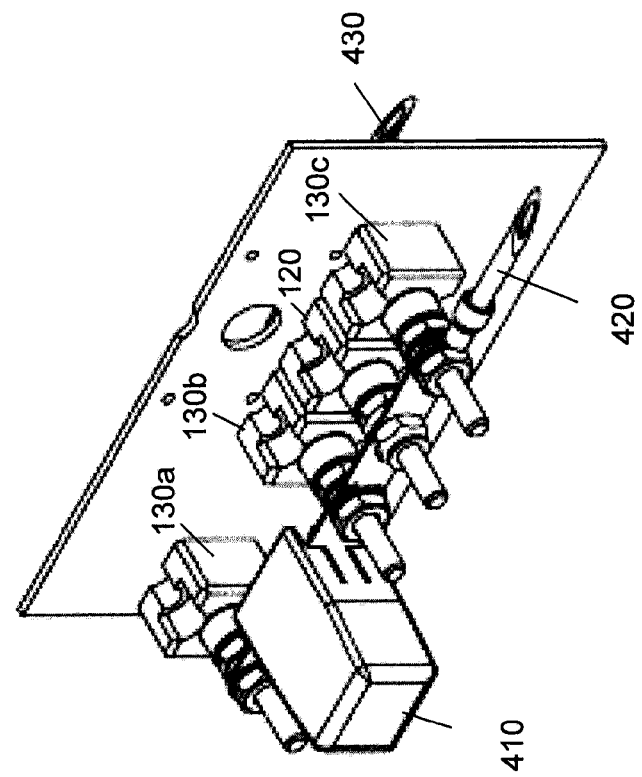

US 8,299,811 B2

UNIVERSAL FRONT/BACK POST TERMINAL BLOCK AND TEST LINK

BACKGROUND

Terminal boards including terminal blocks for terminating and testing of underground railroad wires connected to signals, track circuits and other device on the railroad track or along the wayside are generally protected by and provided within a bungalow or similar structure at various locations along a railroad track. Current terminal board configurations may include multiple terminal blocks installed on an aluminum sheet. An insulated test link is installed between two terminal blocks, and a surge protection component, such as a lightning arrester, is also installed between two terminal blocks, with the insulated test link and the surge protection component sharing one common terminal block. The underground cable, from the common terminal block, is typically routed to the rear of the aluminum sheet and passes through the floor or a wall of the bungalow. Factory wiring is connected at the terminal block to equipment inside the bungalow for providing power and/or control signals to the equipment located on the track or along the wayside.

Such a configuration requires a piece of plywood or other suitable material to be incorporated on the rear side of the aluminum sheet. Moreover, with current terminal board configuration designs, labor installation is time consuming and difficult due to the necessity of terminating cables and installing a surge protector and test link. Field maintenance is also undesirably inconvenient due to the requirement of testing cables and replacing defective components such as the lightning arresters. Additionally, costs associated with wiring material and wiring labor are high. Thus, an improved terminal board configuration is desired.

BRIEF DESCRIPTION OF THE DRAWINGS

The following detailed description is better understood when read in conjunction with the appended drawings. Exemplary embodiments are shown in the drawings, however, it is understood that the embodiments are not limited to the specific methods and instrumentalities depicted herein. In the drawings:

FIG. 2 is a perspective view of a terminal block, according to an embodiment.

FIG. 3a is a perspective view of a control test link, according to an embodiment.

FIG. 3b is a perspective view of a test nut, according to an embodiment.

FIG. 4 is a schematic design of a terminal board assembly, according to an embodiment.

DETAILED DESCRIPTION

In the following detailed description, a plurality of specific details, such as arrangement of wiring and terminal blocks, are set forth in order to provide a thorough understanding of the preferred embodiments discussed below. The details discussed in connection with the preferred embodiments should not be understood to limit the present inventions. Furthermore, for ease of understanding, certain method steps are delineated as separate steps; however, these steps should not be construed as necessarily distinct nor order dependent in their performance.

Figure 1:
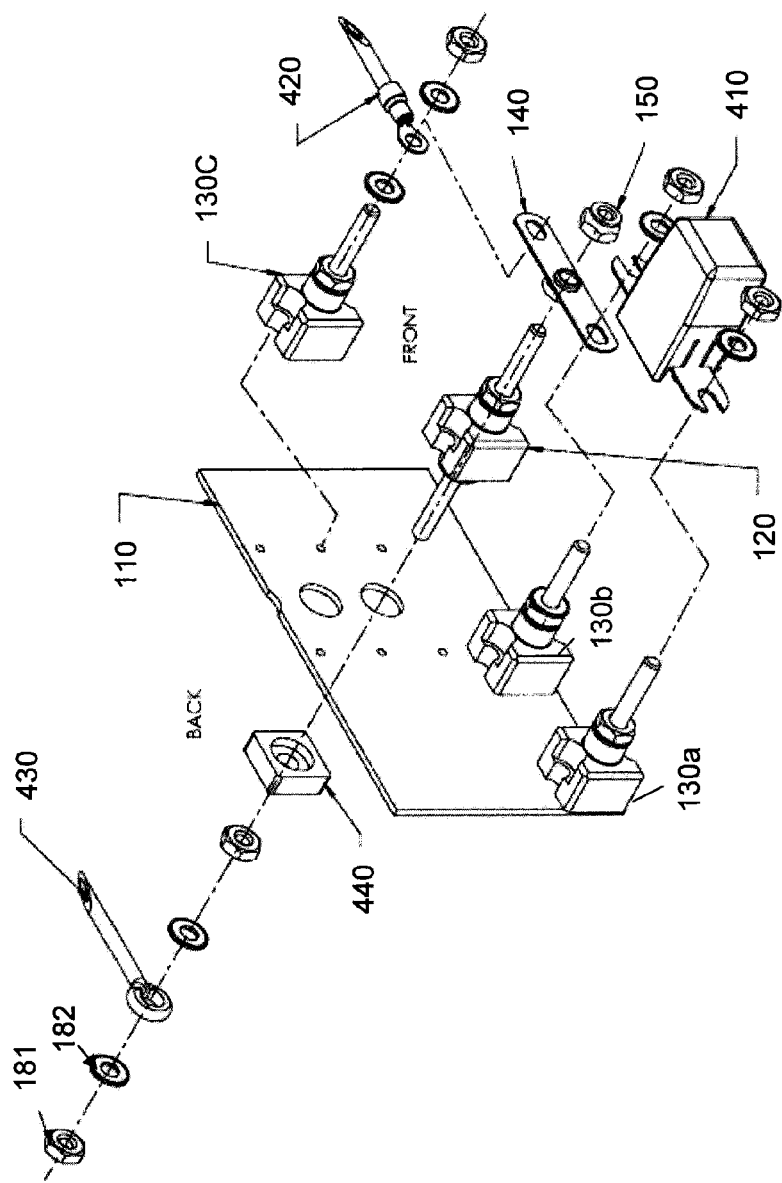
FIG. 1 is a schematic design of a terminal board, according to an embodiment.

With reference to FIG. 1, a terminal board 100, according to an embodiment, is illustrated. The terminal board 100 includes a plane 110, a first terminal block 120, a plurality of terminal blocks 130, a control test link 140, and a test nut 150. The plane may be of a conductive material, such as aluminum, for example to serve as a low impedance ground plane. It should be understood that the plane 110 may be mounted on, or form part of a vertical wall located within a bungalow (not shown in FIG. 1) such that the front of the plane may be accessed when entering the bungalow through a front entrance and a back of the plane may be accessed from a rear entrance of the bungalow or by walking around the wall. It should be understood that several rows of terminal blocks 120, 130 may be mounted on a plane 110, with the terminal blocks in one horizontal row in close proximity to, and in some cases in contact with, terminal blocks in a vertically adjacent row. Configurations with 12 or 24 rows of terminal blocks are not uncommon.

With reference to FIG. 2, details of the first terminal block 120 are illustrated. The first terminal block 120 includes a front post 121, a back post 122, a terminal block body 123, and a back shoulder 124 for electrical isolation from the plane 110. The front post 121 and the back post 122 are electrically connected to one another via the body 123 and the back shoulder 124 and, in some embodiments, are formed of a steel rod extending through the body 123 and back shoulder 124. One or more protrusions 125 are provided to reduce stress due to torque or an uneven surface of the plane 110. One or both of the posts 121, 122 may be threaded, preferably with a thread approved by the AAR (American Association of Railroads). The first terminal block 120 is configured to be installed on the plane 110 so that the back post 122 extends through the plane 110 and so that the terminal block body 123 and the back shoulder 124, along with the front post 121, are positioned on and extend from a front surface of the plane 110.

Referring again to FIG. 1, the terminal board 100 has three terminal blocks 130 installed on the plane 110, but the terminal board 100 is not limited to any particular number of terminal blocks 130. Each of the terminal blocks 130 has a front post, and the terminal blocks 130 are configured and installed on the plane 110 so that the front posts extend in an outward direction from the front surface of the plane 110.

The control test link 140 of the terminal board 100 is shown in greater detail in FIG. 3a. The control test link 140 includes at least three holes: a first hole 141, a second hole 142, and a third hole 143. The second hole 142 is lined with an insulating material 144 that extends past a bottom edge and a top edge of the second hole 142. According to an embodiment, the first hole 141 is sized to accept a front post of one of the plurality of terminal blocks 130, the second hole 142 is sized to accept the front post 121 of the first terminal block 120, and the third hole 143 is sized to accept a front post of another of the terminal blocks 130. The insulating material 144 serves to electrically isolate the control test link 140 from the front post 121 of the first terminal block 120 in the absence of a test nut which will be described in further detail below.

Again referring back to FIG. 1, the alignment of the holes 141, 142, and 143 of the control test link 140 with the first terminal block 120 and the plurality of terminal blocks 130 is shown.

The test nut 150 is configured to be connectable to the front post 121 of the first terminal block 120. FIG. 3b provides greater detail of the test nut 150. The test nut 150 has a front face 151 and a rear face 152 with a depression 153 formed therein, the depression being sized to allow the rear face 152 of the test nut to contact the control test link 140 when installed on the front post 121 of the first terminal block 120 over the insulating material 144 of the control test link 140. The test nut also includes a threaded portion 155 configured to mate with the threads of the front post 121 of the first terminal block 120. In this manner, an electrical connection between the front post 121 of the first terminal block 120 and the control test link 140 is formed when the test nut 150 is tightened such that the rear face 152 contacts the control test link 140, and the electrical connection between the first terminal block 120 and the control test link 140 is broken when the test nut is backed off or removed such that the rear face 152 is not in contact with the control test link 140.

The terminal board 100, described with reference to FIGS. 1, 2, 3a, and 3b, may be part of a terminal board assembly 400. With reference to FIG. 4, the terminal board assembly 400, according to an embodiment, is illustrated. In addition to the terminal board 100, the terminal board assembly 400 may include a surge protection component 410 connected between terminals 130a and 130b, and first wiring or cable 420.

The surge protection component 410 may be configured to be installed on a front post of terminal block 130a (this terminal is connected to ground) and on the front post of the terminal block 130b on which the first hole 141 of the control test link 140 is contacted. The surge protection component 410 may be a lightning arrester and/or an equalizer, according to various embodiments.

The first wiring 420 may be connected to the terminal block 130c on which the third hole 143 of the control test link 140 is contacted. The first wiring 420 may be factory wire, pre-installed as part of the terminal board assembly 400 prior to installation in the field. The wiring 420 is connected to control equipment located inside the bungalow in some embodiments.

The terminal board assembly 400 may further include, according to an embodiment, second wiring or cable 430 connected to the back post 122 of the first terminal block 120 with a nut 181 and a washer 182. The second wiring 430 may be underground wiring or cable that is installed in the field once the terminal board assembly 400 is positioned in its desired location.

Moreover, an insulation block 440 (shown in FIG. 1) may also be connected to the back post 122 of the first terminal block 120. The insulation block 440 may be connected to the back post 122 between the second wiring 430 and a back surface of the plane 110 for insulation purposes.

The terminal board assembly 400, according to an embodiment, may be stored within a protective housing often referred to within the railroad industry as a bungalow (not shown in FIG. 1). Multiple terminal board assemblies, similar to the terminal board assembly 400, may be equipped within such a protective housing. For example, a row of 24 assemblies may be provided therein.

The terminal board assembly 400 has several benefits: the second wiring/cable 430 is terminated on the back of the plane 110, while the first wiring/cable 420 is on the front of the plane 110. In embodiments in which the second wiring 430 constitutes an underground cable and the first wiring 420 constitutes wiring connected to equipment located within the bungalow, this arrangement results in separation of all "clean" wiring (i.e., wiring located wholly within the bungalow) from all "dirty" wiring (i.e., wiring extending outside the bungalow). Additionally, installation of the wiring 420 and 430 requires no hole drilling. The surge protection component 410 and the control test link 140 may be pre-installed on the front of the plane 110 in the factory, and the arrangement of FIG. 4 does not require removal of these components during field installation. Moreover, the surge protection component 410 is conveniently the last element on the front build-up, providing for easy removal, replacement, and/or maintenance.

Manufacturing of a terminal board assembly, such as the terminal board assembly 400, may include installing a first terminal block 120 and the other terminal blocks 130 on a pre-punched plane, such as the plane 110. No plywood is required, thus saving material cost. The first wiring 420, as well as the surge protection component 410 and the control test link 140 may be installed prior to placement of the assembly 400 in the field. The second wiring 430 may then be installed by technicians in the field without removal of any of the factory installed components. This is a significant advantage as it reduces installation time in the field and allows factory personnel to ensure that these components are correctly installed.

Figure 5:
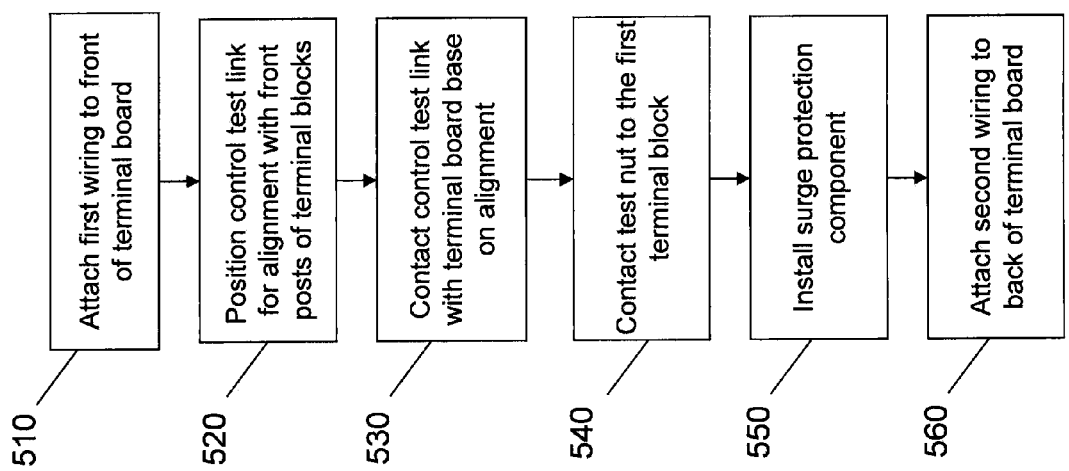
FIG. 5 is a flow chart illustrating a method of installing a control test link on a terminal board.

FIG. 5 is a flow chart 500 illustrating a method of installing a control test link such as the control test link 140, on a terminal board, such as the terminal board 100. At 510, first wiring 420 is attached to the terminal block 130c. As is well known in the art, an eye may be provided at the end of first wiring 420 and this eye may be secured on the front post of the terminal block 130c with a nut. At 520, the control test link 140 is positioned so that the first hole 141, the second hole 142, and the third hole 143 respectively align with a front post of terminal block 130b, the front post 121 of the first terminal block 120, and a front post of terminal block 130c to which the first wiring 420 has been attached.

At 530, the control test link 140 is contacted to the terminal board 100 based upon the alignment to form an attachment with the control test link 140 and the terminal blocks 130 and the first terminal block 120. At 540 of the method, a test nut, such as the test nut 150, is contacted to the front post 121 of the first terminal block 120. At 550, a surge protection component, such as component 410, is installed on a front post of a terminal block 130a and on the front post of the terminal block 130b on which the first hole 141 of the control test link 140 is contacted.

The method may include attaching the wiring. As discussed above, steps 510-550 may be performed in the factory in which a bungalow is manufactured. At 560, second wiring 430 is attached to the back post 122 of the first terminal block 120, which may be performed in the field as discussed above.

Figure 6:
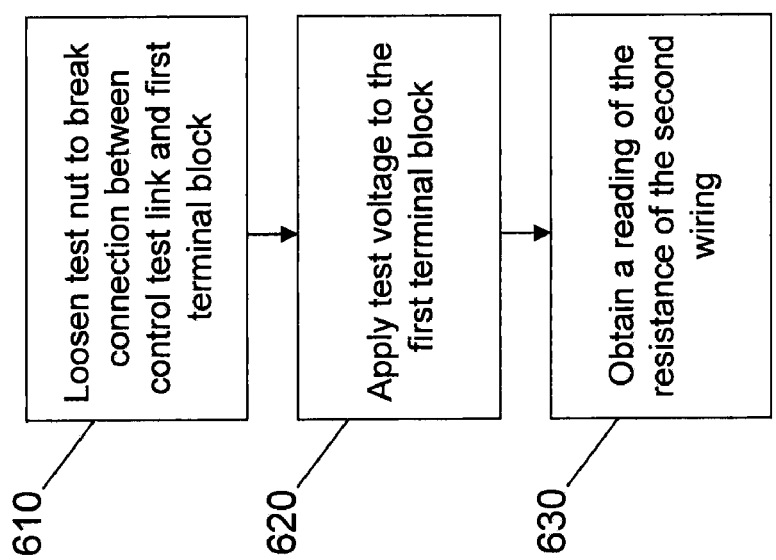
FIG. 6 is a flow chart illustrating a method of applying a megger test to a terminal board assembly.

FIG. 6 is a flow chart 600 illustrating a method of applying a megger test to a cable (often referred to as meggering). A megger test is an insulation resistance test that verifies the insulation properties and its effectiveness in resisting the flow of current by measuring resistance between two points separated by insulation. The megger test may determine if the wiring is shorted to ground or the insulation has become compromised by applying high voltages to determine resistance.

A megger test may be implemented to test the insulation of the second wiring 430 attached to the back post 122 of the first terminal block 120. At 610, the test nut 150 is loosened so that rear face of the nut is moved out of contact with the control test link 140, thereby breaking the electrical connection between the control test link 140 and the first terminal block 120. At 620, a test voltage is applied to the front terminal 121 of the first terminal block 120. The test voltage may be approximately 500 V DC (the test voltage will vary by application). At 630, a resistance of the second wiring 430 is obtained. The resistance reading may be obtained after a period of maintaining the test voltage, such as a period of five seconds, for example. A large resistance indicates that the insulation of the second wiring 430 is effective.

Thus, the megger test of FIG. 6 is conveniently and easily achieved by simply opening the test nut 150 to provide cable separation from the surge protection component 410.

Figure 7:
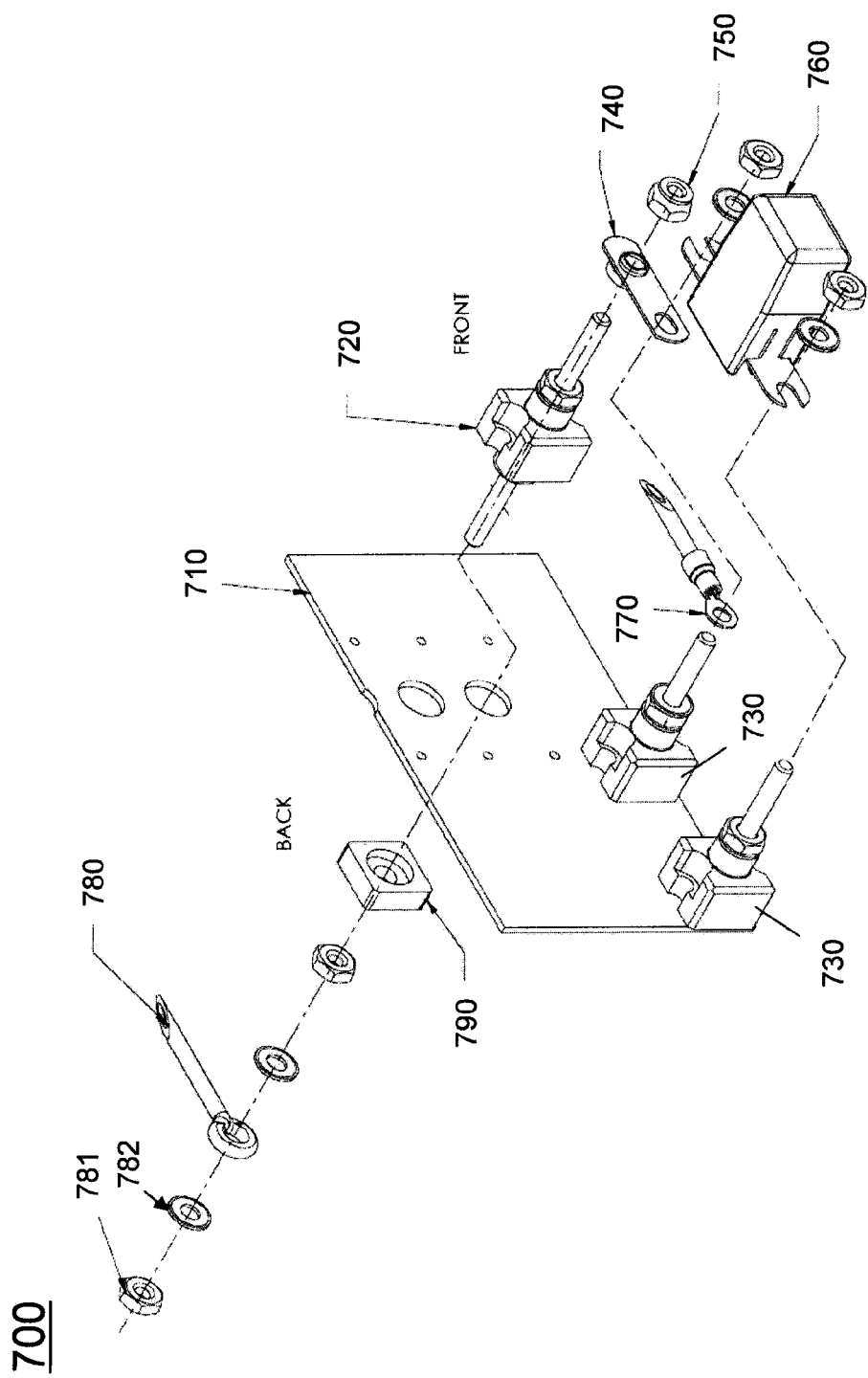
FIG. 7 is a schematic design of a terminal board assembly, according to an additional embodiment.

With reference to FIG. 7, a schematic design of a terminal board assembly 700, according to an additional embodiment, is shown. The terminal board assembly 700 may include a terminal board with a first terminal block 720, terminal blocks 730, a control test link 740, and a test nut 750.

The terminal board assembly 700 may incorporate three terminals, for example, such as a first terminal block 720 and two terminal blocks 730, although additional terminal blocks may also be included. The first terminal block 720 and the other terminal blocks 730 are installed on a plane 710. The first terminal block 720, similar to the first terminal block 120 described above with relation to the terminal board 100, has a front post and a back post and may be configured to that the back post extends through the plane 710 and the front post extends from a front surface of the plane 710. The terminal blocks 730 may each have a front post. The terminal blocks may be installed on the plane 710 so that the front posts extend from the front surface of the plane 710.

The control test link 740 has a first hole 741 and a second hole 742, the second hole 742 being lined with an insulating material that extends past a bottom edge and a top edge of the second hole 742. The first hole 741 is sized to accept a front post of one of the terminal blocks 730, and the second hole 742 is sized to accept the front post of the first terminal block 720.

The test nut 750 is configured to be connectable to the front post of the first terminal block 720. The test nut has a face with a depression formed therein, where the depression is sized to allow a portion of the test nut 750 to contact the control test link 740 when installed on the front post of the first terminal block 720 over the insulating material of the control test link 740.

The terminal board assembly 700 may further include a surge protection component 760. The surge protection component 760 is installed on a front post of a terminal block 730 and on the front post of another terminal block 730 on which the first hole 741 of the control test link 740 is contacted. The surge protection component 760 may include one or both of an arrester and an equalizer.

The terminal board assembly 700 may further include first wiring 770. The first wiring, or cable, 770 is connected to the terminal block 730 on which the first hole 741 of the control test link 740 is contacted.

The terminal board assembly 700 may also include, according to an embodiment, second wiring or cable 780 connected to the back post of the first terminal block 720 with a nut 781 and washer 782. The second wiring 780 may be underground wiring or cable that is installed in the field.

Moreover, an insulation block 790 may also be connected to the back post of the first terminal block 720 between the second wiring 780 and a back surface of the plane 710 for insulation purposes.

Similar to the terminal board assembly 400 described above with respect to FIG. 4, the terminal board assembly 700 may be stored within a protective housing (not shown). Multiple terminal board assemblies, such as a row of 24 assemblies, may be equipped within such a protective housing.

The embodiment of FIG. 7 has one less terminal than the embodiment of FIG. 4, which is advantageous. However, this embodiment suffers from the disadvantage that it requires that a wire be mounted to the terminal 730 in the center of the three terminals in the row. This can present difficulties when multiple rows of terminals 730, 720 are arranged in close physical proximity to each other as there may not be sufficient room in which to route the wire to the terminal 730.

Figure 8:
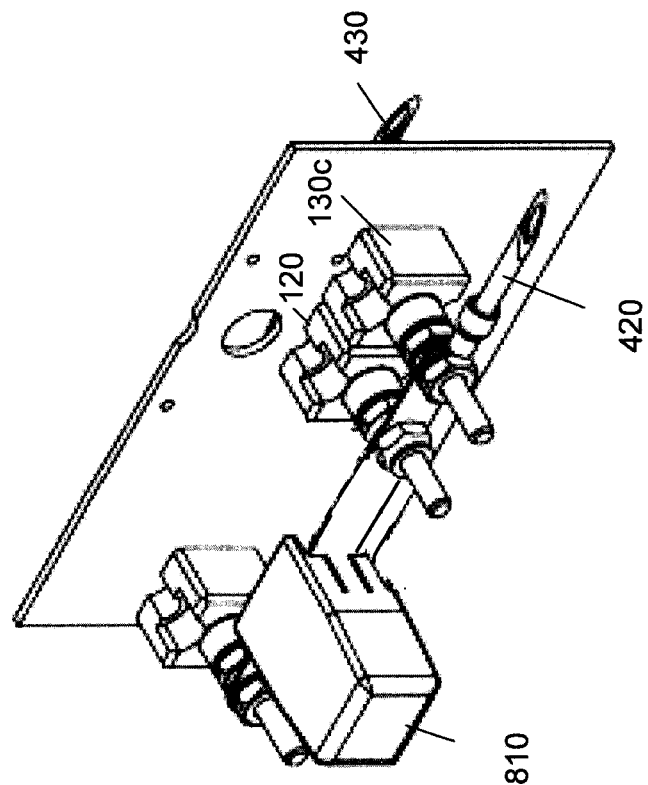
FIG. 8 is a perspective view of an integrated arrester and control test link according to an embodiment.

Referring now back to FIG. 4, it can be seen that the terminal 130b serves the purpose of providing a connection between one leg of the arrester 410 and the control test link 140. It is possible to eliminate the terminal 130b by providing an arrester 410 with a leg having an integral control test link with only two holes (one hole insulated to accept the front post of the first terminal block 120 and a second hold without insulation to accept the front post for terminal 130c). An example of such an embodiment 810 is shown in FIG. 8. Such an embodiment, while advantageous in that it allows the elimination of a terminal block, suffers from a drawback in that it requires the removal of nuts from three posts in order to replace the arrester 410.

The foregoing examples are provided merely for the purpose of explanation and are in no way to be construed as limiting. While reference to various embodiments are shown, the words used herein are words of description and illustration, rather than words of limitation. Further, although reference to particular means, materials, and embodiments are shown, there is no limitation to the particulars disclosed herein. Rather, the embodiments extend to all functionally equivalent structures, methods, and uses, such as are within the scope of the appended claims.

The invention claimed is:

1. A terminal board comprising:
    a plane;
    a first terminal block installed on the plane, the first terminal block having a electrically connected front and back post, wherein the back post extends through and is isolated from the plane;
    a plurality of terminal blocks installed, on the plane, each of the plurality of terminal blocks having a front post;
    a control test link having a first hole, a second hole and a third hole, the second hole being lined with an insulating material that extends past a bottom edge and a top edge of the second hole, wherein the first hole is sized to accept a front post of one of the plurality of terminal blocks, wherein the second hole is sized to accept the front post of the first terminal block, and wherein the third hole is sized to accept a front post of another of the plurality of terminal blocks; and
    a test nut connectable to the front post of the first terminal block, the test nut having a face with a depression formed therein, the depression being sized to allow a portion of the test nut to contact the control test link when installed on the front post of the first terminal block over the insulating material of the control test link.

2. The terminal board of claim 1, wherein the plane comprises a conductive material to serve as a low impedance ground plane.

3. The terminal board of claim 1, further comprising:
    a surge protection component, wherein, the surge protection component includes a first leg in contact with a front post of one of the plurality of terminal blocks and a second leg in contact with the front post of another of the plurality of terminal blocks on which the first hole of the control test link is contacted; and first wiring connected to the terminal block on which the third hole of the control test link is contacted.

4. The terminal board assembly of claim 3, wherein the surge protection component comprises at least one of an arrester and an equalizer.

5. The terminal board assembly of claim 3, further comprising an insulation block connected to the back post of the first terminal block.

6. The terminal board assembly of claim 3, wherein the terminal board assembly is stored within a protective housing.

7. The terminal board assembly of claim 3, further comprising second wiring connected to the back post of the first terminal block.

8. A terminal board assembly comprising:
a terminal board, the terminal board comprising:
 a plane;
 a first terminal block installed on the plane, the first terminal block having a front post and a back post, wherein the back post extends through the plane;
 a plurality of terminal blocks installed on the plane, each of the plurality of terminal blocks having a front post;
 a control test link having a first hole and a second hole, the second hole being lined with an insulating material that extends past a bottom edge and a top edge of the second hole, wherein the first hole is sized to accept a front post of one of the plurality of terminal blocks, and wherein the second hole is sized to accept the front post of the first terminal block; and
 a test nut connectable to the front post of the first terminal block, the test nut having a face with a depression formed therein, the depression being sized to allow a portion of the test nut to contact the control test link when installed on the front post of the first terminal block over the insulating material of the control test link;
the terminal board assembly further comprising:
a surge protection component, wherein the surge protection component is installed on a front post of a terminal block and on the front post of the terminal block on which the first hole of the control test link is contacted; and
first wiring connected to the terminal block on which the first hole of the control test link is contacted.

9. The terminal board assembly of claim 8, wherein the surge protection component comprises at least one of an arrester and an equalizer.

10. The terminal board assembly of claim 8, wherein the terminal board assembly is stored within a protective housing.

11. The terminal board assembly of claim 8, further comprising second wiring connected to the back post of the first terminal block.

* * * * *